United States Patent
Chung et al.

(10) Patent No.: US 7,846,843 B2
(45) Date of Patent: Dec. 7, 2010

(54) METHOD FOR MANUFACTURING A SEMICONDUCTOR DEVICE USING A SPACER AS AN ETCH MASK FOR FORMING A FINE PATTERN

(75) Inventors: Chai O Chung, Gyeonggi-do (KR); Jong Min Lee, Gyeonggi-do (KR); Chan Bae Kim, Gyeonggi-do (KR); Hyeon Ju An, Gyeonggi-do (KR); Hyo Seok Lee, Gyeonggi-do (KR); Sung Kyu Min, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 608 days.

(21) Appl. No.: 11/939,215

(22) Filed: Nov. 13, 2007

(65) Prior Publication Data
US 2009/0001044 A1    Jan. 1, 2009

(30) Foreign Application Priority Data
Jun. 29, 2007    (KR) ...................... 10-2007-0065489

(51) Int. Cl.
*H01L 21/311* (2006.01)
(52) U.S. Cl. .................. 438/703; 438/717; 438/724; 438/736; 438/743; 438/744; 216/57; 216/74; 216/81; 216/108
(58) Field of Classification Search ................. 438/703, 438/717, 724, 736, 743, 744; 216/57, 74, 216/81, 108
See application file for complete search history.

(56) References Cited

U.S. PATENT DOCUMENTS

| | | | |
|---|---|---|---|
| 6,573,030 | B1 | 6/2003 | Fairbairn et al. |
| 2004/0140530 | A1* | 7/2004 | Kalburge et al. ............. 257/565 |
| 2006/0128055 | A1* | 6/2006 | Cheng et al. .................. 438/83 |
| 2006/0211260 | A1 | 9/2006 | Tran et al. |
| 2006/0228904 | A1 | 10/2006 | Riley et al. |
| 2007/0099431 | A1* | 5/2007 | Li ............................... 438/735 |
| 2007/0224823 | A1* | 9/2007 | Sandhu ...................... 438/694 |
| 2008/0008969 | A1* | 1/2008 | Zhou et al. .................. 430/313 |
| 2008/0111184 | A1* | 5/2008 | Beintner et al. ............. 257/327 |
| 2008/0197394 | A1* | 8/2008 | Caspary et al. ............. 257/300 |

FOREIGN PATENT DOCUMENTS

| | | |
|---|---|---|
| KR | 1020050091702 A | 9/2005 |
| KR | 1020050102465 A | 10/2005 |
| KR | 1020070058578 A | 6/2007 |

* cited by examiner

*Primary Examiner*—Binh X Tran
(74) *Attorney, Agent, or Firm*—Ladas & Parry LLP

(57) ABSTRACT

A process for manufacturing a semiconductor device using a spacer as an etch mask for forming a fine pattern is described. The process includes forming a hard mask layer over a target layer that is desired to be etched. A sacrificial layer pattern is subsequently formed over the hard mask layer. Spacers are formed on the sidewalls of the sacrificial layer pattern. The protective layer is formed on the hard mask layer portions between the sacrificial patterns formed with the spacer. The sacrificial layer pattern and the protective layer are then later removed, respectively. The hard mask layer is etched using the spacer as an etching mask. After etching, the spacer is removed. Finally, the target layer is etched using the etched hard mask as an etching mask.

16 Claims, 4 Drawing Sheets

METHOD FOR MANUFACTURING A SEMICONDUCTOR DEVICE USING A SPACER AS AN ETCH MASK FOR FORMING A FINE PATTERN

CROSS-REFERENCE TO RELATED APPLICATIONS

The present application claims priority to Korean patent application number 10-2007-0065489 filed on Jun. 29, 2007, which is incorporated herein by reference in its entirety.

BACKGROUND OF THE INVENTION

The present invention relates to a method for manufacturing a semiconductor device, and more particularly, to a method for manufacturing a semiconductor device that can easily form a fine pattern.

As semiconductor devices become highly integrated, the critical dimensions and distances of patterns have been miniaturized. Generally, in the manufacture of a semiconductor, exposure and etching processes are performed to form a desired pattern. Specifically, forming a photoresist pattern over a pattern forming film using a lithography process forms the pattern. The pattern forming film is subsequently etched using the photoresist pattern as an etching mask.

Accordingly, the lithography technology is an important element to form the fine pattern. Conventional lithography is performed by exposing a pattern of a reticle on the photoresist using KrF or ArF and developing the pattern of a reticle to form the photoresist pattern.

However, in a highly integrated semiconductor device, a step height is raised and the pattern formation method using a photoresist with ArF for exposure poses a limitation. The limitation results from an optical effect due to a short wavelength and a chemical effect induced by using a chemically amplified photoresist.

To overcome this limitation, a method of forming a nitride layer series material or amorphous carbon over a target layer to be etched and used as an etching mask has been utilized. Hard material other than the photoresist as previously mentioned used as an etching mask is referred to as a hard mask.

Hereafter, a method for forming a pattern using a hard mask according to the conventional art will be briefly described.

A hard mask layer made of a nitride layer series material or amorphous carbon is formed over a pattern forming film, i.e. over the target layer to be etched. An anti-reflective layer made of a material such as SiON, is formed over the hard mask layer. A photoresist is then coated over the anti reflective layer and the photoresist coating is sequentially exposed and developed forming a photoresist pattern.

The anti-reflective layer and the hard mask layer are etched using the photoresist pattern as an etching mask to form a hard mask. The remaining photoresist pattern is then removed. The remaining SiON anti-reflective layer and photoresist pattern are removed together. The removal of the photoresist pattern may be omitted. The target layer is etched using the hard mask as an etching mask to form a desired pattern.

However, the integration of semiconductor devices is progressing much faster than the development of exposure apparatuses. As a result, it is impossible to form the fine pattern required for a semiconductor device of 40 nm technology or less with current exposure apparatuses. Further, a pattern forming method using a hard mask cannot attain a fine size hard mask in a semiconductor device having a feature size less than 40 nm and causes an additional problem, i.e., pattern collapse.

Therefore, there is an urgent need for a method of forming the fine pattern required by a semiconductor device of 40 nm technology or less utilizing an existing exposure apparatus to eliminate the need for further investment in a new exposure apparatus.

BRIEF SUMMARY OF THE INVENTION

The embodiments of the present invention are directed to a method for manufacturing a semiconductor device that can easily form a fine pattern required by a semiconductor device having a feature size less than 40 nm using an existing exposure apparatus.

In one embodiment, a method for manufacturing a semiconductor device may include the steps of: forming a hard mask layer over a target layer to be etched; forming a sacrificial layer pattern over the hard mask layer; forming spacers on sidewalls of the sacrificial layer pattern; forming a protective layer on the hard mask layer portions between the sacrificial patterns formed with the spacer; removing the sacrificial layer pattern leaving the spacers; removing the protective layer; etching the hard mask layer using the spacer as an etching mask; removing the spacer; and etching the target layer using the etched hard mask as an etching mask.

The hard mask layer is a laminated layer of an amorphous carbon layer and a SiON layer or a SiN layer.

The amorphous carbon layer is formed at a temperature of 500~700° C.

The SiON layer or the SiN layer is formed at a temperature of 100~400° C.

The sacrificial layer is an oxide layer.

The oxide layer is formed to have A TEOS/$O_2$ ratio of 0.1~0.5%.

The oxide layer is formed in a plasma enhanced chemical vapor deposition (PECVD) process.

The PECVD process is implemented by applying a plasma power of 300~800 W.

The step of forming the protective layer further includes the steps of: forming the protective layer over the hard mask layer to cover the sacrificial pattern formed with the spacer; and etching the protective layer to expose the sacrificial pattern.

The protective layer is a photosensitive film or an amorphous carbon layer.

The step of removing the sacrificial layer is implemented using a wet chemical.

The wet chemical is a 1:10~1:20 mixture of HF:DI.

The spacer is a polysilicon layer.

The polysilicon layer is formed in a CVD process.

The CVD process is implemented at a temperature of 300~500° C.

The step of removing the protective layer is implemented with an $O_2$ plasma treatment.

DESCRIPTION OF SPECIFIC EMBODIMENTS

A preferred embodiment of the present invention is directed to a semiconductor package in which a fine pattern is formed using a spacer as an etching mask on a semiconductor. According to an embodiment of the present invention, it is possible to control a pattern size regardless of the resolution of an exposure apparatus by controlling only a spacer deposition thickness.

Therefore, in an embodiment of the present invention, it is possible to avoid the cost of a new exposure apparatus and reduce costs through utilization of an existing exposure apparatus.

It is possible to form the fine pattern independent of the resolution of an exposure apparatus and therefore achieve a highly integrated semiconductor device of 40 nm technology or less because it is possible to control a pattern size by controlling only a spacer deposition thickness when using the spacer as an etching mask.

Hereafter, a method for manufacturing a semiconductor device in accordance with an embodiment of the present invention will be described with reference to the attached drawings.

FIGS. 1A through 1H are cross-sectional views illustrating the steps of a method for manufacturing a semiconductor device in accordance with an embodiment of the present invention.

Figure 1A:
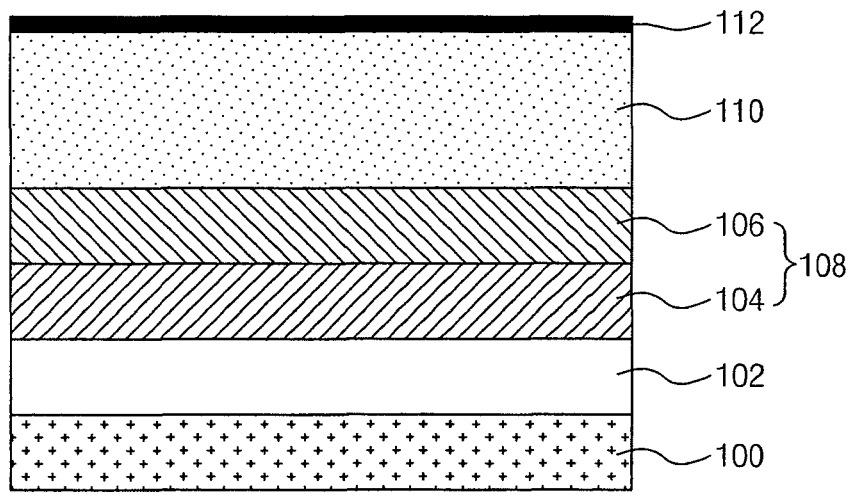
FIGS. 1A through 1H are cross-sectional views illustrating the steps of a method for manufacturing a semiconductor device in accordance with an embodiment of the present invention.

Referring to FIG. 1A, hard mask layer 108 is composed of a laminated layer of a first hard mask layer 104 and a second hard mask layer 106. Hard mask layer 108 is formed over a semiconductor substrate 100 having a target layer 102 to be etched. A sacrificial layer 110 and an anti-reflective layer 112 are sequentially formed over the hard mask layer 108.

The first hard mask layer 104 is formed of an amorphous carbon layer at a temperature of 500~700° C. The second hard mask layer 106 is formed of a SiON layer or a SiN layer at a temperature of 100~400° C. The sacrificial layer 110 is an oxide layer formed in a plasma enhanced chemical vapor deposition (PECVD) process. The PECVD process is performed where a plasma power of 300~800 W is applied to facilitate removal with a wet chemical in the subsequent process and the $TEOS/O_2$ ratio is below 0.5%, preferably 0.1~0.5%. The anti-reflective layer 112 is formed of a bottom anti-reflective coating (BARC) layer.

Figure 1B:
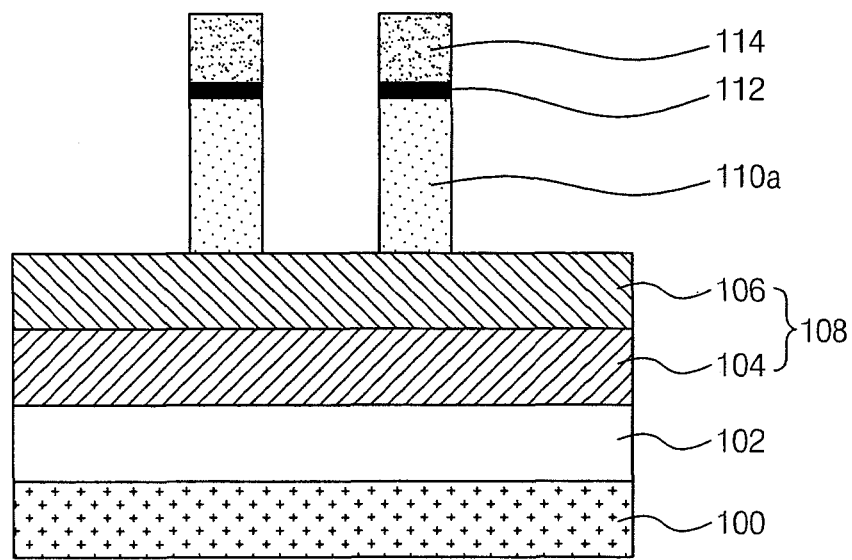

Referring to FIG. 1B, a photosensitive film is coated, exposed and developed over the anti-reflective layer 112 to form a photosensitive film pattern 114. A sacrificial layer pattern 110a is formed by using the photosensitive film pattern 114 as an etching mask and etching the anti-reflective layer 112 and the sacrificial layer 110 to expose the second hard mask layer 106.

Figure 1C:
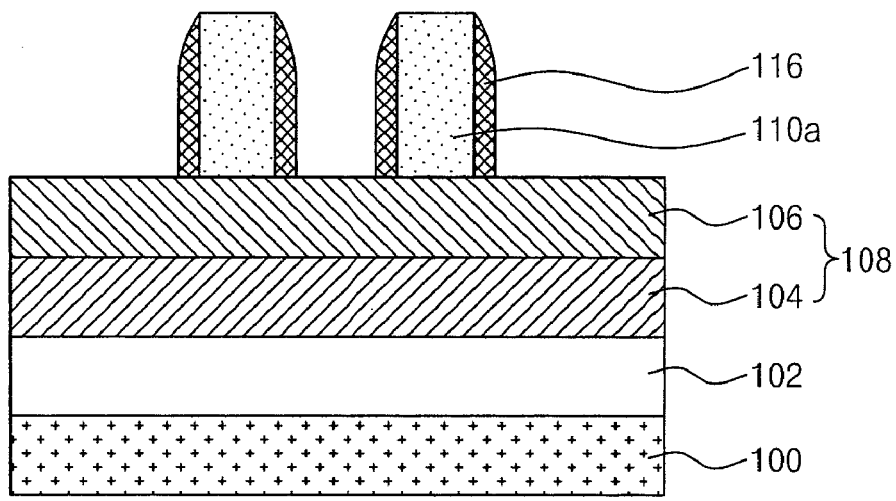

Referring to FIG. 1C, the remaining photosensitive film pattern 114 and anti-reflective layer 112 over the sacrificial layer pattern 110a is removed. A spacer layer is deposited over the second hard mask layer 106 including the sacrificial layer pattern 110a according to a profile of the second hard mask layer 106 and the sacrificial layer pattern 110a. The spacer layer is then etched back to form spacers 116 over the sidewalls of the sacrificial layer pattern 110a. The spacer 116 is a silicon nitride layer formed according to a CVD process at a temperature of 300~500° C.

Figure 1D:
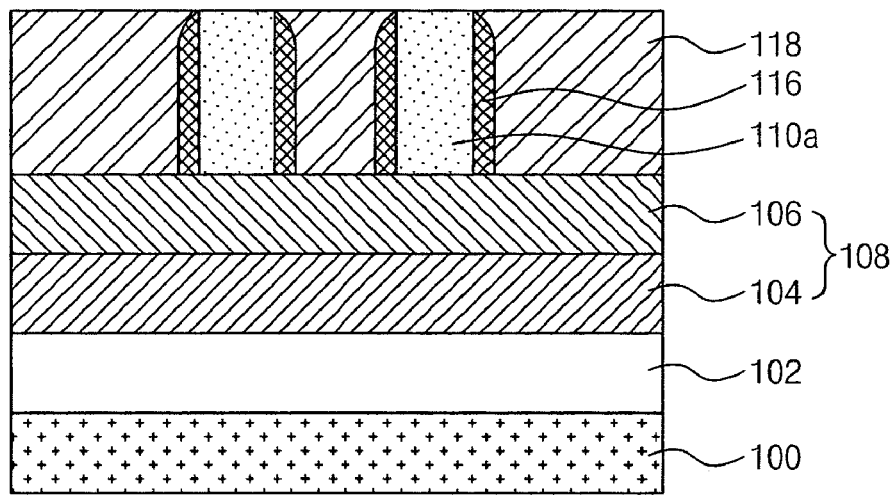

Referring to FIG. 1D, a protective layer 118 is formed over the second hard mask layer 106 covering the sacrificial layer pattern 110a formed with the spacer 116. The protective layer 118 is formed of a photosensitive film or an amorphous carbon layer. The protective layer 118 prevents a loss of the second hard mask layer 106 during the subsequent process of removing the sacrificial layer pattern 110a. The protective layer 118 is preferably formed to have a thickness to prevent the loss of the second hard mask layer 106 during the removal of the sacrificial layer pattern 110a.

Figure 1E:
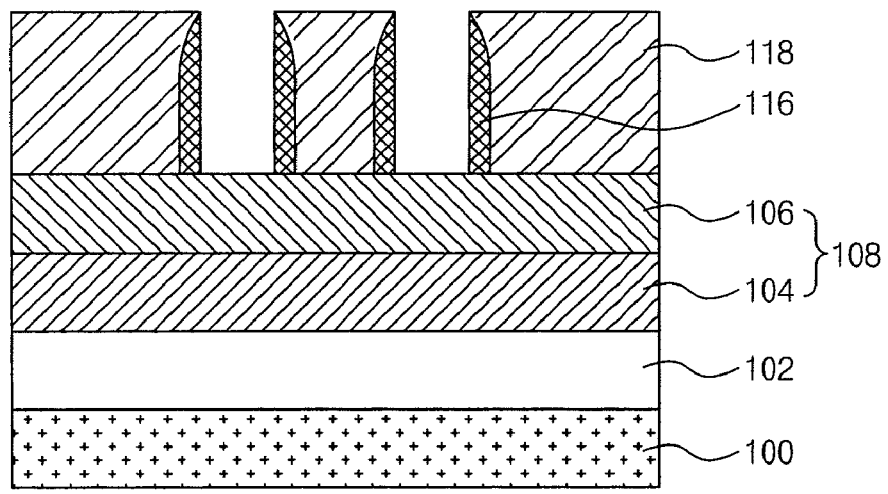

Referring to FIG. 1E, the sacrificial layer pattern 110a is removed by a wet etching process using a wet chemical to expose the second hard mask layer 106. A solution mixture of HF and DI generally used to remove an oxide layer having increased HF, where the HF:DI ratio is 1:10 to 1:20, is used as the wet chemical in the wet etching process to remove the sacrificial layer pattern 110a.

Figure 1F:
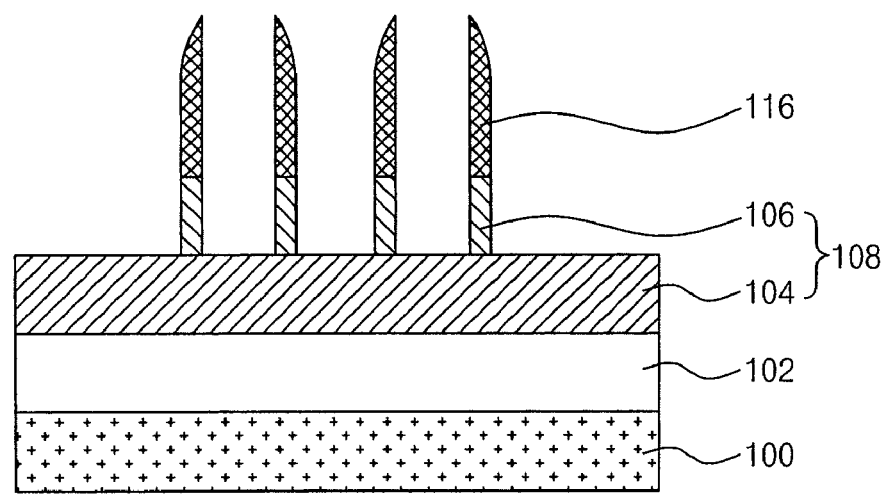

Referring to FIG. 1F, the protective layer 118 disposed over the second hard mask layer 106 is removed by an $O_2$ plasma treatment. The second hard mask layer 106 is etched using the spacer 116 remaining on the second hard mask layer 106 as an etching mask.

Figure 1G:
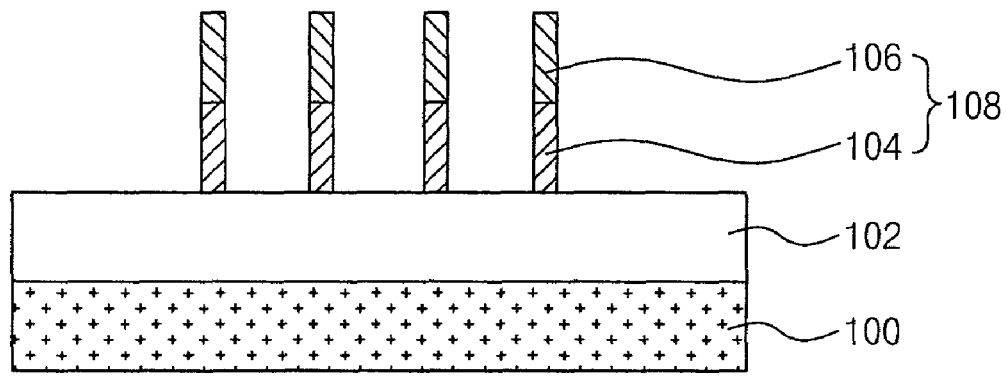

Referring to FIG. 1G, the spacer 116 is removed. The first hard mask layer 104 is subsequently etched to expose the target layer 102 using the etched second hard mask layer 106 as an etching mask.

Figure 1H:
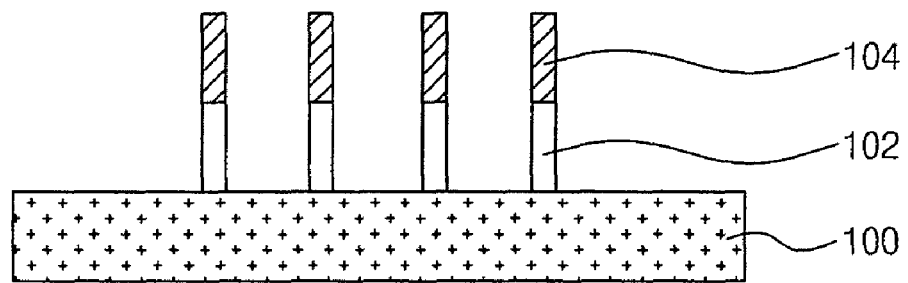

Referring to FIG. 1H, the etched second hard mask layer 106 is removed. The target layer 102 is etched using the first hard mask layer 104 as an etching mask to form a desired fine pattern 102a.

A series of known follow up processes (not shown) are sequentially performed completing the manufacture of the semiconductor device having a fine pattern.

As is apparent from the above description, in an embodiment of the present invention, it is possible to form the fine pattern with an existing exposure apparatus since the fine pattern is formed using a spacer as an etching mask. As a result, the present invention is advantageous because costs are reduced, as there is no need to invest in a new exposure apparatus.

Further, according to an embodiment of the present invention, it is possible to form a fine pattern having a desired size by controlling only a spacer thickness since a spacer is used as an etching mask. It is therefore possible to stably form the fine pattern since the formation of the fine pattern is independent of the exposure apparatus resolution.

Consequently, it is possible to manufacture a reliable semiconductor device that is highly integrated.

Although specific embodiments of the present invention have been described for illustrative purposes, those skilled in the art will appreciate that various modifications, additions, and substitutions are possible without departing from the scope and the spirit of the invention as disclosed in the accompanying claims.

What is claimed is:

1. A method for manufacturing a semiconductor device, comprising the steps of:
   forming a hard mask layer over a target layer to be etched;
   forming a sacrificial layer pattern over the hard mask layer;
   forming spacers on sidewalls of the sacrificial layer pattern;
   forming a protective layer on the hard mask layer portions between the sacrificial patterns formed with the spacer;
   removing the sacrificial layer pattern leaving the spacers;
   removing the protective layer;
   etching the hard mask layer using the spacers as an etching mask;
   removing the spacers; and
   etching the target layer using the etched hard mask as an etching mask.

2. The method for manufacturing a semiconductor device according to claim 1, wherein the step of forming the protective layer further comprises the steps of:
   forming the protective layer over the hard mask layer to cover the sacrificial pattern formed with the spacer; and
   removing the protective layer to expose the sacrificial pattern.

3. The method for manufacturing a semiconductor device according to claim 1, wherein the protective layer is formed of a photo resist film or an amorphous carbon layer.

4. The method for manufacturing a semiconductor device according to claim 1, wherein the step of removing the protective layer is implemented with an $O_2$ plasma treatment.

5. The method for manufacturing a semiconductor device according to claim 1, wherein the step of removing the sacrificial layer is implemented using a wet chemical.

6. The method for manufacturing a semiconductor device according to claim 5, wherein the wet chemical is a 1:10~1:20 mixture of HF:DI.

7. The method for manufacturing a semiconductor device according to claim 1, wherein the hard mask layer is a laminated layer of an amorphous carbon layer and a SiON layer or SiN layer.

8. The method for manufacturing a semiconductor device according to claim 7, wherein the amorphous carbon layer is formed at a temperature of 500~700° C.

9. The method for manufacturing a semiconductor device according to claim 7, wherein the SiON layer or the SiN layer is formed at a temperature of 100~400° C.

10. The method for manufacturing a semiconductor device according to claim 1, wherein the sacrificial layer is an oxide layer.

11. The method for manufacturing a semiconductor device according to claim 10, wherein the oxide layer is formed to have a $TEOS/O_2$ ratio of 0.1~0.5%.

12. The method for manufacturing a semiconductor device according to claim 10, wherein the oxide layer is formed in a plasma enhanced chemical vapor deposition (PECVD) process.

13. The method for manufacturing a semiconductor device according to claim 12, wherein the PECVD process is implemented by applying a plasma power of 300~800 W.

14. The method for manufacturing a semiconductor device according to claim 1, wherein the spacer is a polysilicon layer.

15. The method for manufacturing a semiconductor device according to claim 14, wherein the polysilicon layer is formed in a chemical vapor deposition (CVD) process.

16. The method for manufacturing a semiconductor device according to claim 15, wherein the CVD process is implemented at a temperature of 300~500° C.

* * * * *